United States Patent [19]

Vasile

[11] 4,063,202
[45] Dec. 13, 1977

[54] BAND-PASS FILTER WITH SURFACE ACOUSTIC WAVE DEVICES

[75] Inventor: Carmine F. Vasile, Thousand Oaks, Calif.

[73] Assignee: Rockwell International Corporation, El Segundo, Calif.

[21] Appl. No.: 683,608

[22] Filed: May 5, 1976

[51] Int. Cl.$^2$ .................. H03H 9/26; H03H 9/32; H03H 13/00

[52] U.S. Cl. .................... 333/72; 310/313; 310/367; 333/30 R

[58] Field of Search .............. 333/30 R, 72, 1, 3; 330/5.5; 310/8, 8.1, 8.2, 9.8; 358/166

[56] References Cited

U.S. PATENT DOCUMENTS

| 3,715,674 | 2/1973 | Bahr ........................... 331/96 X |
| 3,790,828 | 2/1974 | Chao .......................... 333/30 R X |
| 3,831,116 | 8/1974 | Davis, Jr. et al. ............... 333/72 |
| 3,965,446 | 6/1976 | Craven et al. ................... 333/72 |

OTHER PUBLICATIONS

Smith et al., Design of Surface Wave Delay Lines with Interdigital Transducers in IEEE Transactions on Microwave Theory and Techniques, vol. MTT-17, No. 11, Nov. 1969: pp. 865-873.

Smith et al., Analysis of Interdigital Surface Wave Transducers by Use of an Equivalent Circuit model in IEEE Transactions on Microwave Theory and Techniques, vol. MTT-17, No. 11, Nov. 1969: pp. 856-864.

Primary Examiner—Alfred E. Smith
Assistant Examiner—Marvin Nussbaum
Attorney, Agent, or Firm—L. Lee Humphries; Craig O. Malin

[57] ABSTRACT

At least one of several transducers on a piezoelectric substrate is externally short-circuited by a series resonance circuit for suppression of triple transit echoes. The resonance circuit is additionally connected to an amplifier via a high input or output impedance. In multi-transducer systems any two transducers are prevented from communicating via echo signals by such resonance circuits. In filter cascades several resonance circuits may be included in the interstage coupling circuit or between the input and output amplifiers on the one hand and the cascade on the other hand.

28 Claims, 3 Drawing Figures

BAND-PASS FILTER WITH SURFACE ACOUSTIC WAVE DEVICES

BACKGROUND OF THE INVENTION

The present invention relates to electrical, high-frequency filters using the frequency selectivity of the generation and pick-up of acoustic surface waves on a suitable piezoelectric material to obtain band pass filtering; such filters are also called surface acoustic wave filters for short.

A typical filter of the type referred to above includes a flat piezoelectric wafer as substrate which carries at least two sets of interdigitized comb-like finger electrodes, one set or pair of combs acting as transmitter for acoustic surface waves, the other set or pair of combs acts as pick-up or receiving transducer. A voltage applied between adjacent fingers of the one pair of combs deforms the crystal elastically resulting in an elaastic wave which propagates across the surface of the piezoelectric body. An elastic deformation polarizes the affected surface of the crystal and sets up a voltage between the electrode fingers of the other pair of combs provided these fingers are spaced in accordance with the polarization pattern that results from the particular surface wave.

It is inherent in such a device that either transducer is not inherently a transmitter or a receiver. Rather, the interaction between the electrode fingers on the piezoelectric substrate is strictly reversible. An elastic deformation in the substrate produced an electric voltage potential which can be detected (and current can be drawn) by a conductive electrode right at the deformed substrate surface; a voltage potential of such an electrode relative to the substrate body or relative to a different surface portion produces an elastic deformation of the substrate. Thus, the voltage between a pair of combs resulting from an arriving surface wave, causes this transducer to launch surface waves on its own. Consequently, an arriving signal will be retransmitted. Moreover, the terms transmitting transducer and receiving transducer have meaning only with regard to their use in an electric circuit; an electrical signal is applied to one and an electrical signal is extracted from the other. Such connections and use do not eliminate from the transmitting transducer its capability of responding to any incoming surface wave nor is the receiving transducer disabled for transmitting surface waves.

As a consequence of the afore-mentioned phenomenon, such a two transducer device exhibits so-called triple transit echos. Specifically, as the transmitting transducer launches a surface wave, the receiving transducer picks it up and generates a corresponding output voltage. However, the receiving tranducer as so stimulated acts also as transmitter and returns an acoustic signal to the transmitter proper. A portion of that signal is received by the transmitting transducer and retransmitted again (second echo), and another acoustic signal returns to the pick-up and receiving transducer, having traversed the distance between the transducer three times as compared with the single transit that occurred on initial stimulation by the transmitter.

If that triple transit echo were very low, it could be neglected. However, it may be only 12 db down from the proper signal level. The triple transit echo has, of course, at least substantially the same informaton content as the original signal as received by the receiving transducer, but that echo arrives one full round trip between the transducers later. As that delay may involve a few microseconds it is per se not negligible and may appear, for example, as a "ghost" if the filter is used in an i.f. channel in a television set. In addition, these triple transit echoes distort the band pass frequency response of such a device in that the response exhibits a ripple with an undulation of about 4 db.

Strictly speaking, the echo producing process continues resulting in quintuple, septuple, etc. transit echoes. However, these echo signals produce relatively insignificant disturbences. Moreover, upon reducing triple transit echoes one can expect these other echoes to be correspondingly reduced; i.e. they do not present a separate problem. On the other hand, the triple transit echo is just one example for echo signals. Surface waves or any other elastic distortion in the substrate will cause e.g. the transmitting transducer to act as receiver and retransmitter. Thus, unless other echoes and other types of reflections are inhibited otherwise, they too will produce echo signals in the receiver proper.

Various attempts have been made to impede the retransmission of signals by a receiving transducer. However, these attempts are related primarily to low terminating resistances which are insufficient and tend to introduce noise.

SUMMARY DESCRIPTION OF THE INVENTION

It is an object of the present invention to find a solution to the problem caused by triple transit echoes in solid state devices using acoustic surface waves.

It is a specific object of the invention to eliminate or at least significantly reduce triple transit echoes in surface-acoustic filters.

It is another object of the present invention to avoid communication of surface wave transducers via echo signals.

I have discovered that at least one of the transducers should be electrically power-mismatched by using a series resonance circuit, tuned to the center frequency of the surface acoustic device, to which, in turn, is connected a very high load impedance, being either the output impedance or the input impedance of an amplifier dependent upon the intended function of this transducer. The series resonance circuit short-circuits pass band signals and acts as impedance converter for the high load impedance connected to it. As a consequence of the particular circuit configuration, the short-circuited transducer will, in fact, not operate as a retransmitter for any received surface wave. The other transducer is powermatched to its respective input or output circuit (depending on the function of the transducer). This second transducer will act as retransmitter and return an echo, but the triple transit signal requires participation of both transducers, and echo suppression by and in one of them suffices!

The circuit connected to the transducer to be short-circuited for pass band signals should be constructed so that the input or output voltages respectively as applied to or developed by the filter appear across the capacitors of the respective series resonance circuit, and the capacitor should be proportioned so that the voltage is relatively high. This way, it is possible to offset the power mismatch and the low power gain on account of the shortcircuiting. The input or output amplifier should have a very high gain for the same reason, but a high capacitor voltage for coupling input and/or output of the filter to external circuitry minimizes insertion loss. As that amplifier is to have high input or output impedance, the signal to noise ratio is hardly degraded, as compared with fully power-matched input and output circuits or low terminating resistance of the transducers in such a filter.

Upon considering a broader aspect of the invention, a surface acoustic wave device having a plurality of transducers coupled to a substrate to obtain launching and detection of surface waves must be electrically connected to input and/or output circuits so that any two of these transducers cannot communicate with each other via surface waves except on the basis of electrical signals applied externally to one of them. By way of example, a piezoelectric substrate may be coupled to three transducers, a central one flanked by two outer ones. The central transducer may be controlled to act as transmitter and the two outer transducers receive the surface waves launched by the central one. The relationship may be reversed in that the outer ones launch surface waves to be received by the central transducer. In either of these cases the outer transducers should be short-circuited by series resonance circuits, while the central one should be power-matched to its respective input or output device. Any pair of transducers of this assembly is incapacitated to receive any signal that was not externally applied. A single echo (re-transmission) may still be produced by the central transducer, but not in either one of the two outer transducers.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

Proceeding now to the detailed description of the drawings, FIG. 1 shows a flat Lithium-niobate substrate 10 carrying three sets of arrays of interleaved strips, electrodes or fingers which are interconnected to establish pairs of interdigitized combs. Each of these three pairs constitutes a transducer, which is coupled to the substrate 10 for electrical interaction therewith. As shown, for example, in my copending application Ser. No. 662,761, filed Mar. 1, 1976, the central transducer is preferably of larger dimensions and apodized, i.e. the finger overlap is particularly contoured for generating a particular pass band response. These aspects are not of immediare significance for the present invention. Suffice it to say that the finger spacings of the three transducers are quite similar and determine the band pass frequencies of the device acting as a band pass filter.

Figure 1:
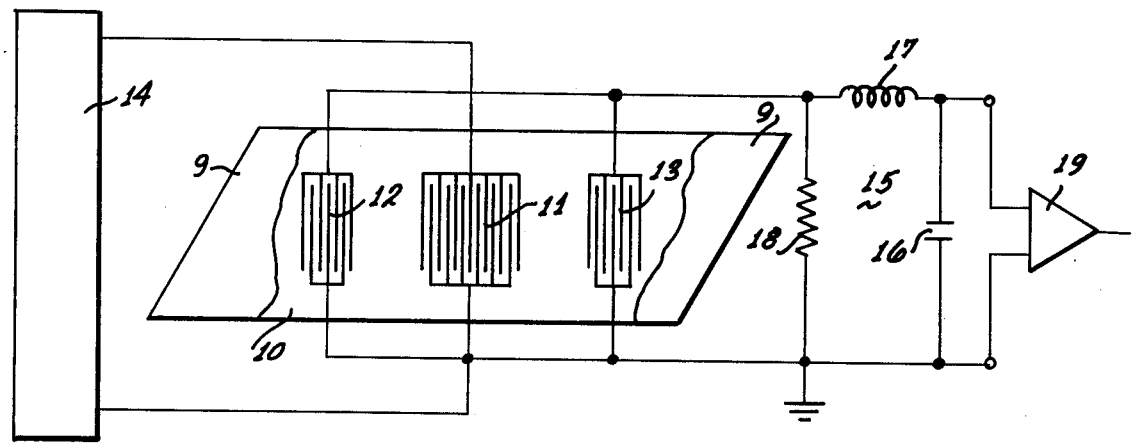
FIG. 1 is a circuit diagram of a surface acoustic wave filter incorporating the preferred embodiment of the present invention.

The centrally positioned transducer 11 is connected to a source 14 for electrical h.f. signals. Thus, the interdigitized array of electrode fingers of transducer 11 are electrically energized and produce acoustic surface waves which propagate in both directions towards the two outer transducers 12 and 13. The transducers 12 and 13 when receiving these acoustic surface waves produce corresponding voltages between their respective two arrays of interdigitized fingers. Corresponding arrays (e.g. those stimulated in phase) of the two transducers 12 and 13 are electrically interconnected so that these two receiving transducers produce a common electrical output.

The substrate 10 is of a parallelogram configuration with short sides extending obliquely to the direction of propagation of surface acoustic waves between the transducers. Surface waves travelling from any of the transducers in directions parallel to the long sides of the parallelogram will be specularly reflected by the oblique side edges to be redirected thereby, essentially out of the range of any of the transducers. A portion of the surface area adjacent to these oblique edges may be covered by padding 9 made of a damping material so that these surface waves are attenuated significantly immediately prior to as well as subsequent to the reflection at the oblique side edges.

Recapitulating briefly the problem: the transmitter-transducer 11 when stimulated electrically launches acoustic surfaces towards the outer transducers 12 and 13 which generate corresponding electrical signals in these outer transducers to serve as output of the device. However, the transducers 12 and 13 themselves stimulate also the piezoelectric substrate unless prevented and they generate acoustic waves on their own accord. These waves propagate towards the central transducer 11 which picks these waves up and, unless prevented, transducer 11 provides also for another surface acoustic wave transmission. Thus, transducer 11 actually transmits the same signal twice, but with a delay corresponding to the double transit time between transmitter 11 on the one hand and either of transmitters 12 and 13 on the other hand. This second transmission is received accordingly by the two outer transducers. The particular signal now received has traveled three times the distance between transmitting and receiving transducers. The second pick-up of the "same" signal, i.e. of the triple transit echo signal, results in a significantly lower level output but not sufficiently low not to produce a noticeable signal in the output circuit of the filter.

The triple transit echo suppression is now carried out as follows. The output electrodes of transducers 12 and 13 are interconnected by a series L – C circuit 15 which includes a capacitor 16 and a coil 17. The L – C circuit is resonant at the center frequency of the pass band of the filter. Thus, the output transducers are short-circuited at pass band frequencies. Moreover, the voltage across the capacitor 16 is fed as an input to an amplifier 19 whose input impedance is selected to serve as a very high impedance load (ideally infinitely high). Since the L-C circuit 15 acts actually as an impedance converter, the filter still "sees" a very low output impedance. A resistor 18 in front of the resonance circuit 15 does not change these conditions, but serves to stabilize the amplifier. The resistor 18 suppresses out-of-band responses, for which the circuit 15 is no longer resonant!

As a consequence, the output circuit 15 – 19 for the filter is power-mismatched to the filter and very little power is taken therefrom. The input circuit 14 for the device, however, is presumed to be a power-matched signal generator which drives the filter. A similar series resonance circuit is not needed on all of the transducers, because, as stated above, the full round trip of an echo needs to be interrupted in one of two communicating transducers only.

In view of the fact that only a short-circuit current is coupled out of the filter, the power available at the output transducers 12, 13 is very low. This loss is offset in a two-fold manner. The amplifier 19 is selected to have a very high gain; it is preferably a field effect transistor but a regular, bipolar transistor amplifier may also suffice. It is, however, desirable to provide the amilifier with a low noise capability which is readily possible if one uses a FET and a very high input resistor. The latter is needed also for reasons of a low load impedance on the transducers 12, 13 as per the principle feature of the invention. The second feature for offsetting the low output of the device is to select the capacitor 16 so that the device develops a rather high voltage across the capacitor which actually reduces to some extent the otherwise necessary gain of amplifier 19 for restoring the signal to a more useful level. Of course, capacitor 16 and coil 17 could be exchanged.

It can thus be seen that the device operates as follows. The signal generator 14 drives the transmitting transducer 11 which generates suface acoustic waves. These waves propagate towards the two outer transducers 12 and 13, which are stimulated and since they are electrically tied together, they generate a voltage which is being applied across the resonance circuit 15. Due to the very small load impedance across transducers 12 and 13 the latter will not pick up significant amounts of power, and the resonance circuit draws only short circuit current under conditions which reduce the transducer output voltage to a very small value. Therefore, neither of the transducers 12, 13 will be able to retransmit an echo wave; only a short circuit current is coupled out by the high impedance amplifier 9. the acoustic waves actually propagate through the transducers 12, 13, substantially unabated until reaching the end of the wafer, where the absorbing padding 9 attenuates the waves to prevent rebounding. It was found that the triple transit echo is significantly impeded in this manner.

The circuit shown in FIG. 1 teaches several general aspects which are relevant for practicing the invention in a variety of configurations. The first aspect can be derived from just two of the transducers, e.g. 11 and 12. The echo suppression by operation of impedance mismatching through short-circuiting one of the transducers prevents that one transducer (e.g. 12) from acting as retransmitter of a received wave. The other transducer does not have to be so prevented. On the other hand, where three or more transducers (or n transducers) are provided on a substrate, either all of the transmitting transducers and all but one of the receiving transducers, or all of the receiving transducers must have the echo suppression circuit. From a still different point of view, no two transducers must be able to communicate with each other via surface waves, wherein (a) at least one is a (genuinely) receiving transducer and (b) neither of which has a low impedance (short circuit) load for the pass band signals.

Figure 2:
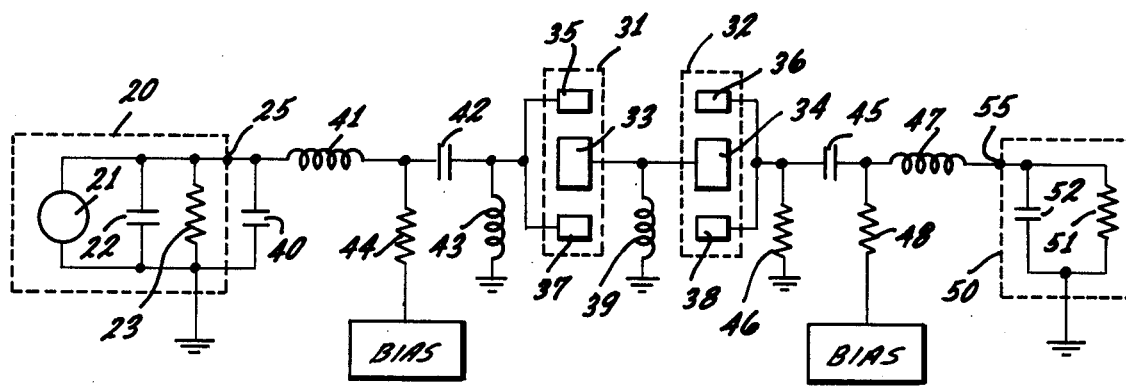
FIG. 2 is a diagram of an equivalent circuit of a filter cascade in an i.f. channel.

FIG. 2 illustrates a more complete filter system incorporating the invention. The circuit can be construed as the equivalent circuit for an i.f. filtering channel in a TV set. Reference numeral 20 denotes a signal current source, which includes, for example, an amplifier stage 21 receiving an i.f. input and providing a signal voltage at a very low current on account of a very high impedance 23 of the current source. Reference numeral 22 represents the internal capacitance of the signal source. The output is taken from a terminal 25. The circuit depicted in FIG. 2 includes additionally a two stage filter cascade 31, 32 establishing a band pass filtering system which receives a signal to be filtered from the current source 20 and provides an input to the input terminal 55 of a circuit 50 being merely represented by its inherent load resistance 51 and load capacitor 52. The circuit 50 includes actually the main i.f. amplifier, video buffer, synch separator etc. However, for purposes of explaining the present invention it is sufficient to represent the destination of the filtered signal merely by the impedance load as effective on the output of the filter cascade.

The terminals 25 and 55 are interconnected by a circuit which includes the filter cascade 31, 32. The filter cascade is constructed from two filter devices 31 and 32 each of which has a piezoelectric substrate which carries a central array of interdigitized electrode fingers as well as two outer arrays of such fingers for respectively establishing three transducers.

The filter device 31 has a central transducer 33, which is flanked by two outer transducers 35 and 37. The filter device 32 has a central transducer 34 which is flanked by two outer transducers 36 and 38. Each of these transducers has a pair of interdigitized combs; one comb of each pair is grounded, the other one receives or provides an electrical signal. The two outer transducers 35, 37 of device 31 are electrically interconnected to operate in parallel and as transmitters. The central transducer 33 of device 31 serves as receiver accordingly. This central transducer 33 is, in turn, connected to the central transducer 34 of device 32 and operates therein as transmitter for surface acoustic waves. The outer transducers 36 and 38 are electrically interconnected to operate in parallel wherby, in effect, their respective signals are summed in phase. The specific cascade-connection of transducer 33 to transducer 34 includes, in addition, a coil 39 acting as coupler network for powermatching the output of filter 31 to the input of filter 32 and vice versa.

The two filter devices or elements 31, 32 could be identical in structure thus exhibiting similar frequency responses. However, in my copending application mentioned above, I have suggested to introduce particular differences in the two filter elements which do not affect their transmission of surface waves, but establish differences in the transmission of bulk waves, so that the respective bulk wave responses are not cascaded. This difference in structure for the two filters does not affect at all the particular circuit connections made in accordance with the present invention. In other words, the bulk wave attenuation by way of cascading as per the copending application is fully compatible with the triple transit echo suppression of the present invention.

My copending application includes also a specific teaching for the attenuation of triple transit echo signals of cascaded surface acoustic wave filters. The specific suppression of parasitic echo signal in accordance with the present invention augments the effect of the attenuation as per my companion application, but the present invention has broader aspects as it relates to the attenuation of any retransmission of a surface wave when received by a transducer, regardless of its origin and regardless of its phase and time relation to any other signal, particularly to any signal whose transmission and passage is desired. The principles expounded above with reference to FIG. 1 are used in the filter network of FIG. 2 as follows.

The output of signal source 20, terminal 25, is connected to the transducers 35, 37 of filter device 31 via a circuit which includes as principal elements a capacitor 40 and a coil 41. The output terminal 25 of the signal source is specifically connected to the junction between coil 41 and capacitor 40 so that the latter connects directly across the signal source output. Hence, the signal from source 20 is applied across the capacitor 40.

Capacitor 40 is effective in parallel to the capacitance 22 of the source 20, and together they constitute a capacitance of a series resonance circuit having coil 41 as operative inductance and resonating at the center frequency of the pass band of cascade 30 as a whole. The other circuit elements in front of filter 31 have auxiliary functions. A capacitor 42 blocks the passage of any d.c. current from the signal source 20 into the filter 31. The coil 43 serves as an equalizer for correcting pass band distortion by the signal source. In addition, coil 43 provides for suppression of out-of-band responses of filter 31. These elements 42, 43 do not change the series resonance established by elements 22, 40, 41 across the electrodes of the transmitting transducers 35 and 37. A resistor 44 provides for proper bias at the operative (non-grounded) terminal of the series resonance circuit 40, 41.

The filter 31 taken individually has an output circuit (coil 39, filter 32) whose impedance is powermatched to the filter 31 as a whole, and the output transducer 33 in particular. On the other hand, the input impedance for filter 31 has maximum mis-match for pass band signals, because the transmitting transducers 35, 37 are shortcircuited for signals having the pass band center frequency on account of the series resonance circuit 22, 40, 41.

Acoustic surface waves transmitted by the transducers 35, 37 travel towards the central transducer 33. On account of the impedance match with the second stage, receiving transducer 33 does act also as retransmitting device, and echo signals are generated and travel towards the outer transducers accordingly. The outer transducers 35, 37, however, are short-circuited for pass band signals by the series resonance circuit, so that these acoustic waves are not picked up by transducers 35 and 37; they pass through the transducers without any significant abatement and travel towards the ends of the piezoelectric substrate where they are absorbed. Thus, an echo signal does not reach transducer 33.

The second stage 32 of the cascade is coupled to the output circuit 50 in similar fashion, the connection circuit being constructed as outlined above with reference to FIG. 1, but includes certain supplemental elements for completing this particular portion of the i.f. channel.

The input of filter 32 is the transmitting transducer 34 which is connected in power-matching configuration to devides 31 and 39; they can be regarded as being equivalent to source 14 in FIG. 1. The surface wave receiving transducers 36, 38 are interconnected and their non-grounded signal line is connected to a series capacitor 45 for blocking d.c. from the circuit.

A resistor 46 is connected directly to transducers 36, 38 for serving as a leakage path for d.c. to prevent any d.c. charge build-up across the electrodes of these transducers. It should be noted that coils 43 and 39 provide inherently d.c. leakage for the other transducers in the cascade system. In addition, resistor 46 being relatively low, suppresses out-of-band responses and stabilizes the circuit 50. It should be noted further that the resistance of impedances 43 and 46 may be of the order of several kilo-ohms only, but should be as high as possible to minimize insertion losses.

The output circuit includes additionally a bias resistor 48 for establishing a more suitable d.c. level for the input of circuit 50. The junction between resistor 48 and blocking capacitor 45 is connected to a series resonance circuit established by a coil 47 and using, e.g. the capacitance 52 of the circuit 50 itself. The signal in terminal 55 may e.g. be used to drive a FET; such a device has a particular gate capacitance which is of sufficient value to permit tuning to the i.f. pass band center frequency by means of the coil 47. The external load impedance 51 is quite high, e.g. circuit 52 - 47 acts as impedance converter. The effective load impedance of the surface wave receiving transducers 36 and 38 is quite small as the transducers "see" primarily the series resonance circuit across their electrodes acting as short circuit for pass band signals.

The operation of this resonance circuit and its specific contribution to triple transit echo suppression in filter 32 is the same as was outlined above with reference to FIG. 1. It can thus be seen that each of the filters 31 and 32 suppresses triple transit echoes because the respective outer transducers fail to act as retransmitters, and any surface wave reaching them passes substantially unabated until reaching the wafer edge, whereby it is absorbed. In each case only a short circuit current is coupled out which, in the case of filter 32, is translated into a relative high voltage across the capacitor 52. The ratio of the voltages across capacitors 52 and 40 may actually exhibit a gain.

Figure 3:
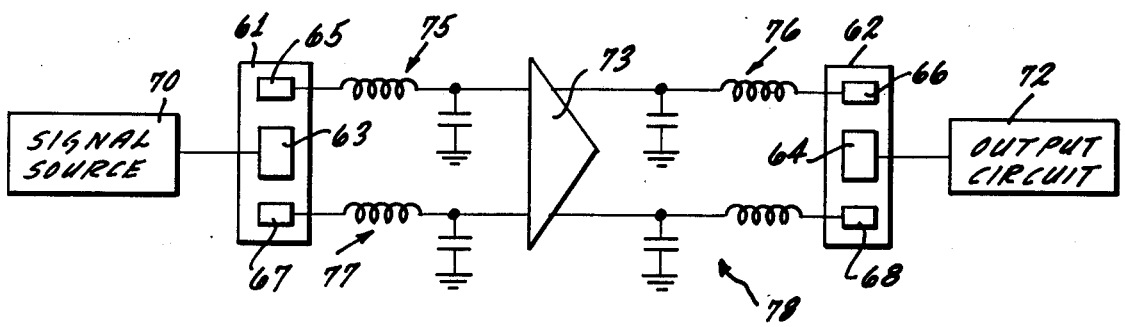
FIG. 3 is a circuit diagram of a modified filter cascade.

The particular configuration of the cascade as shown in FIG. 2 is preferred as can readily be seen when compared with the circuit shown in FIG. 3. However, this circuit constitutes also a mode of practicing the invention. The cascade includes two devices 61 and 62, quite similar to devices 31 and 32, but they are cascaded via their respective outer transducers. More specifically, filter device 61 has its center transducer 63 connected for operation as surface wave transmitter, receiving signals from a source 70. The connection is power-matched. Analogously, the filter device 62 has its center transducer 64 connected to drive an output circuit (amplifier) 72, the connection being likewise power-matched.

The filter devices 61 and 62 are cascaded via their respective outer transducers, but the connection is not a direct one. Rather, each of the outer transducers 65 through 68 is separately short-circuited by a series resonance circuit, all being tuned to the same center frequency of the pass band. These series resonance circuits are respectively denoted by reference numeral 75 through 78.

It will be recalled that each of these resonance circuits acts, in effect, as impedance converter as far as the load for the respective transducer is concerned. Hence, each of the capacitors must be connected across a high impedance device, so that the short circuit conditions on the transducers for pass band signals are maintained. Accordingly, an amplifier 73 with high input impedance and high output impedance is connected between the filters, in that the capacitor / inductor junction of circuits 75 and 77 are connected to the two input terminals of the amplifier 73 acting as summing amplifier and providing similar, in-phase outputs to the capacitor / inductance junction of resonance circuits 76 and 78.

I refer again to my copending application mentioned above and concerning bulk wave suppression. One example therein is based on the assumption that the construction of a filter element is modified so that the signals in the respective outer transducers are in phase opposition to each other. This principle is readily applicable here in that the amplifier 73 can be constructed as differential amplifier providing two, out-of-phase outputs. It can also be seen that such a construction and circuit configuration is fully compatible with the echo suppression by means of resonance circuits connected across several of the transducers as described.

As mentioned earlier, the signal to noise ratio of the filter circuit is not degraded by the employment of high gain amplifiers, provided the amplifier do not introduce noise on their own. The short circuiting by means of tuned circuits has per se a noise suppressing effect. Moreover, the employment of voltage step-up by means of the capacitors in the resonance circuit reduces the gain from a valve necessary in the absence of such capacitive voltage increase.

The invention is not limited to the embodiments described above, but all changes and modifications thereof not constituting departures from the spirit and scope of the invention are intended to be included.

I claim:

1. In an electric band pass filter circuit using at least one solid state acoustic surface wave filter device having at least one transmitting transducer coupled to a piezoelectric substrate and at least one receiving transducer coupled to the same substrate to receive surface acoustic waves transmitted by the transmitting transducer, the filter circuit including a drive circuit for and connected to the transmitting transducer and an output circuit for and connected to the receiving transducer, the improvement comprising:
   one of the drive circuit and output circuit being power-matched to the filter device, the respective other one including a resonance circuit resonating at a frequency in the pass band thereby effectively shortcircuiting the respective transducer at least for the one frequency in the filter pass band, so that upon reception of surface waves by the respective transducer the said transducer retransmits at most neglectable echo; and
   said other circuit including a high impedance effective across the capacitor of the resonance circuit, the resonance circuit acting as load impedance converter for said respective transducer.

2. In a circuit as in claim 1, wherein said resonance circuit is a series resonance circuit having a capacitor and an inductance and being connected across the respective transducer for resonating at a tuned center frequency of the filter device.

3. In a circuit as in claim 2, said other circuit having an inherent capacitance, the capacitance being included in the resonance circuit.

4. In a circuit as in claim 1, wherein said drive circuit includes another wave filter device having transmitting and receiving transducers, at least one of them being connected to circuit means for establishing short circuit load impedance conditions across the one transducer of the other filter device.

5. An electric band pass filter comprising:
   a surface acoustic wave filter having a transmitting transducer coupled to a piezoelectric substrate for launching acoustic surface waves therein, further having a receiving transducer coupled to said substrate for receiving said surface waves; and
   circuit means connected to at least one of said transducers for establishing short circuit load impedance across said transducer, for a frequency in the pass band of said filter, for inhibiting the one transducer from launching surface waves in response to electrical signals generated in the one transducer in response to any surface waves received.

6. A filter as in claim 5, said circuit means being a series resonance circuit acting as impedance converter, the one of the transducers being connected to a high impedance circuit via said impedance converter.

7. An electrical high frequency band pass filtering circuit comprising:
   a surface acoustic wave filter having a piezoelectric substrate cooperating with at least one surface wave transmitting transducer and at least one surface wave receiving transducer, the transducers being acoustically coupled to each other by said substrate;
   first circuit means connected to said transmitting transducer for providing thereto electrical signals driving said transmitting transducer for launching surface waves on said substrate;
   second circuit means connected to said receiving transducer for being responsive to electrical signals generated by the receiving transducer upon receiving said launched surface waves; and
   a resonance circuit resonating at a frequency in the pass band of the filter and being included in one of said first and second circuit means to establish short circuit load conditions across the respective one of the transducers as connected to the one circuit means, at least for signals having said frequency so that the respective transducer retransmits at most neglectable surface waves in response to electrical signals generated by the respective transducer in response to surface waves received.

8. A circuit as in claim 7, said one circuit means including a very high impedance, the resonance circuit being a series resonance circuit acting as impedance converter for establishing short circuit conditions across the one transducer for said frequency.

9. A circuit as in claim 8, said one circuit means including a resistance means connected across one transducer to suppress any off band response.

10. A circuit as in claim 8 said one circuit means including series capacitance means connected between the one transducer and the resonance circuit for blocking the flow of d.c. to the one transducer.

11. A circuit as in claim 7, said first circuit means including another surface acoustic wave filter.

12. A circuit as in claim 11, said resonance circuit being included in said first circuit means, the first circuit means including an amplifier with a high output impedance, the resonance circuit being a series resonance circuit acting as impedance converter and being connected between the amplifier and the first transducer.

13. A circuit as in claim 11, said resonance circuit being included in said second circuit means, the other surface acoustic transducer being power-matched to the first transducer.

14. A circuit as in claim 7, the second circuit means including another surface acoustic wave filter.

15. A circuit as in claim 14, the resonance circuit being included in the second circuit means, the second circuit means further including an amplifier with high input impedance, the resonance circuit being a series resonance circuit acting as impedance converter and connecting the second transducer to the amplifier.

16. A circuit as in claim 14, the resonance circuit being included in the first circuit means, the outer surface wave filter being power-matched to the second transducer.

17. In an electric high frequency band pass filter circuit which connects a source means for such signals to an output and amplifying means, the combination comprising:
- a first surface acoustic wave filter having input and output transducers acoustically coupled by a piezoelectric body;
- first circuit means for connecting the input transducer to said source means;
- a second surface acoustic wave filter having input and output transducers acoustically coupled by a piezoelectric body;
- second circuit means for connecting the output transducer on the second filter to said output and amplifying means;
- third circuit means connecting the output transducer of the first filter to the input transducer of the second filter; and
- at least one of said first, second and third circuit means including resonating circuit means for short-circuiting at least some of the transducers for pass band signal frequencies to inhibit retransmission of a received surface wave signal.

18. In a filter as in claim 16, wherein said first and second circuit means include series resonance circuits which are resonant at a center frequency in the pass band of said filter, the third circuit means providing power match between the two filters.

19. In a filter circuit as in claim 17, wherein each of said series resonance circuits includes a capacitor, the respective capacitors being respectively connected across the output of the source means and across the output and amplifying means.

20. In a filter as in claim 19 wherein said first and second circuit means include a low resistor connected across the respective transducer for suppressing any off band response.

21. In a filter as in claim 18, wherein each of the first and second circuit means include a series capacitor connected between the respective series resonance circuit and the respective transducer for blocking the flow of d.c. into the respective transducer.

22. In a filter circuit as in claim 17 each of said filters having three transducers, one of which being centrally located and flanked by the other two ones as outer transducers, the resonance circuit mean being connected to the two outer ones in each instance.

23. In a filter circuit as in claim 22, the source means having a high impedance, the first means including a series resonance circuit connecting the source means to the outer transducers of the first filter, the amplifying means having high input impedance, the second circuit means including a series resonance circuit and connecting the outer transducers of the second filter to the amplifying means, the central transducers of the two filters being interconnected by the third circuit means in power-matching configuration.

24. In a filter circuit as in claim 22, the third circuit means connecting the outer transducers of the first filter to the outer transducers of the second filter, there being a series resonance circuit connected to each of said outer transducers, the third circuit means including an amplifier with high input and output impedances.

25. An electrical band pass filter comprising:
- a piezoelectric substrate;
- a plurality of transducers coupled to the substrate, at least one of the transducers provided for launching acoustic surface waves, all of the transducers capable of receiving acoustic surface waves, generating electrical signals in response thereto and retransmitting acoustic surface waves in direct response to the generated electrical signals;
- first circuit means connected to said one transducer for providing thereto electrical signals so that the one transducer launches surface waves;
- second circuit means connected to at least one other of the transducers of the plurality for extracting therefrom pass band signals resulting from stimulation of the one other transducer upon receiving surface waves; and
- resonance circuit means included in at least one of the first and second circuit means for short circuiting at least some of said transducers for pass band frequencies thereby retransmitting at most neglectable surface waves so that said second circuit means is stimulated by surface waves only which do not result from any retransmission of surface waves.

26. A filter as in claim 25, wherein said substrate has three transducers arranged so that a centrally positioned one is flanked by two outer ones of the three, the resonance circuit means being connected to the outer transducers.

27. A filter as in claim 26, the resonance circuit means including separate series resonance circuits for outer transducers establishing separately for each of them short circuit load impedance.

28. A filter as in claim 26, the outer transducers being electrically interconnected, the resonance circuit means being a common series resonance circuit for providing short circuit load impedance for both of the outer transducers.

* * * * *